(12) United States Patent
Delpiano et al.

(10) Patent No.: US 7,085,448 B2
(45) Date of Patent: Aug. 1, 2006

(54) OPTICAL WAVELENGTH CONTROL SYSTEM

(76) Inventors: Franco Delpiano, Agilent Technologies Italia, Via G. Reiss Romoli, 274, 10148, Torino (IT); Giuseppe Achille Azzini, Agilent Technologies Italia, Via G. Reiss Romoli, 274, 10148, Torino (IT)

( * ) Notice: Subject to any disclaimer, the term of this patent is extended or adjusted under 35 U.S.C. 154(b) by 221 days.

(21) Appl. No.: 10/798,142

(22) Filed: Mar. 11, 2004

(65) Prior Publication Data

US 2004/0179774 A1    Sep. 16, 2004

(30) Foreign Application Priority Data

Mar. 12, 2003  (EP)  .................................. 03251480

(51) Int. Cl.
  *G02B 6/28*  (2006.01)
(52) U.S. Cl. ............................... 385/24; 385/39; 372/6
(58) Field of Classification Search .................. 385/16, 385/24, 14, 37, 39; 372/29.021, 6, 32, 20, 372/9, 28, 31; 398/101, 115, 118, 124, 178
See application file for complete search history.

(56) References Cited

U.S. PATENT DOCUMENTS

| | | | |
|---|---|---|---|
| 5,781,572 A | 7/1998 | Tahara et al. ................... 372/34 |
| 5,825,792 A | 10/1998 | Villeneuve et al. ............ 372/32 |
| 6,094,446 A | 7/2000 | Tei et al. ........................ 372/32 |
| 6,226,424 B1 * | 5/2001 | Ball et al. ........................ 385/14 |
| 6,310,703 B1 * | 10/2001 | Alavie et al. ................... 398/34 |
| 6,377,592 B1 * | 4/2002 | Auracher et al. ............... 372/9 |
| 6,384,947 B1 | 5/2002 | Ackerman et al. ........... 359/187 |
| 6,400,739 B1 | 6/2002 | Auracher ...................... 372/32 |
| 6,404,528 B1 * | 6/2002 | Pfeiffer ......................... 398/202 |
| 6,526,079 B1 * | 2/2003 | Watterson et al. ............. 372/32 |
| 6,807,204 B1 * | 10/2004 | O'Dowd ....................... 372/32 |
| 2003/0053169 A1 * | 3/2003 | Nasu et al. ................... 359/133 |
| 2004/0022282 A1 * | 2/2004 | Lano et al. .................... 372/32 |

FOREIGN PATENT DOCUMENTS

| | | |
|---|---|---|
| EP | 0 818 857 | 1/1998 |
| JP | 07095159 | 7/1995 |
| WO | WO 01/11739 | 2/2001 |
| WO | WO 01/28052 | 4/2001 |

OTHER PUBLICATIONS

K. Anderson, "Design and Manufacturability Issues of a Co-packaged DFB/MZ Module", IEEE Electronic Components and Technology Conference, 1999, pp. 197-200.
Patent Abstract of Japan, European Patent Office, JP 07095159, Tokyo electric Power Co. Inc.

* cited by examiner

*Primary Examiner*—Akm Enayet Ullah

(57) ABSTRACT

An optical wavelength control system for an optical source includes a beamsplitter arrangement for propagating radiation from the source over two paths. First and second photodetectors are arranged each in a respective one of said two propagation paths, while a wavelength selective optical filter is interposed in the propagation path from the source to the first photodetector. The first and second photodetectors generate photocurrents indicative of the possible displacement of the actual wavelength of the radiation from said source with respect to a reference wavelength and the power emitted by the optical source, respectively. The system includes a support bench extending in a given plane and the beamsplitter arrangement is arranged to split the radiation from said source towards the photodetectors in a direction substantially perpendicular to the given plane of the support bench.

18 Claims, 2 Drawing Sheets

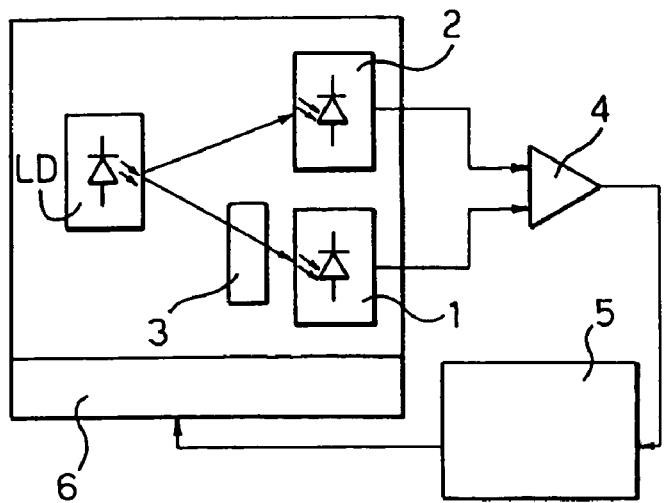
Fig_1
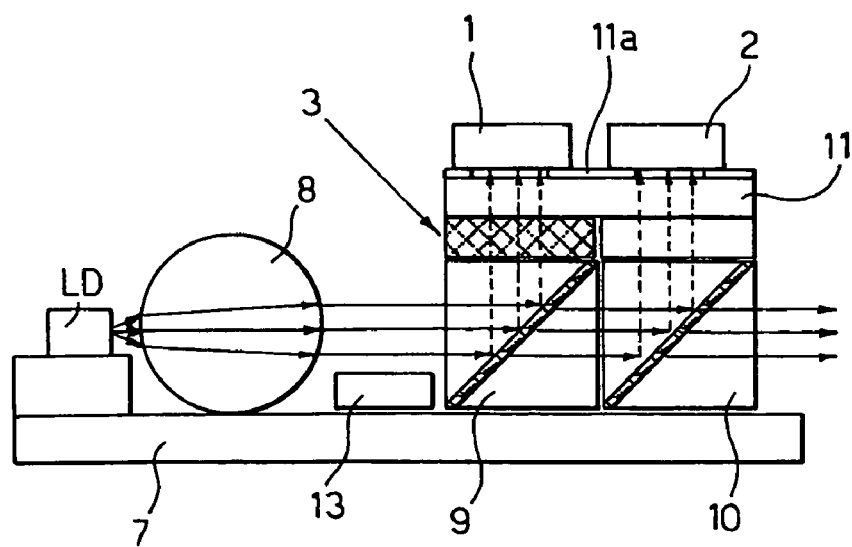
Fig_2

OPTICAL WAVELENGTH CONTROL SYSTEM

BACKGROUND OF THE INVENTION

1. Field of the Invention

The present invention relates to optical wavelength control systems and was devised by paying specific attention to the possible use in optical communication systems. However, reference to this preferred field of use must in no way be construed as limiting the scope of the invention.

2. Brief Description of Related Developments

Commercial WDM (Wavelength Division Multiplex) transmission systems, such as "dense" WDM (DWDM) systems provide high transmission capacity by using reduced channel spacing (e.g. 100–50 GHz). Real time monitoring and control is thus necessary in order to ensure the channel peak wavelength stability required for the optical sources used in such systems.

A number of devices adapted for that purpose (and primarily for wavelength monitoring) are based on the arrangement currently referred to as "wavelength locker". This usually consists of two photodiodes sampling two portions of the optical beam (typically a laser beam). One of the photodiodes, used as a reference, samples an unfiltered portion of the laser beam. Another portion of the laser beam is passed through an optical filter and caused to impinge onto the second photodiode. The response (i.e. the photocurrent) of the first diode is thus indicative of the power emitted by the optical source; the response of the second diode is a function of the possible displacement of the actual wavelength of the beam generated by the laser source with respect to the wavelength of the filter.

A beam splitter is used to split the laser beam into a main beam to be used for the intended application (e.g. for launching into a fiber) and one or more secondary beam or beams to be directed towards the photodiodes of the locker arrangement.

Various arrangements are known in order to effect stabilisation. For instance, in the case of diode lasers, a Peltier element can be used as a wavelength stabilising element by controlling the temperature of the laser diode, while power stabilisation is effected by controlling the laser bias current.

Arrangements of the general type referred to in the foregoing, or substantially similar thereto, are disclosed e.g. in U.S. Pat. No. 5,825,792, U.S. Pat. No. 6,094,446 and U.S. Pat. No. 6,377,592 B1.

Specifically, the arrangement of U.S. Pat. No. 5,825,792 comprises a narrow bandpass, wavelength selective transmission filter element, of Fabry-Perot etalon structure, through which a non-collimated beam from a laser source is directed onto two closely spaced photodetectors. For wavelength stabilisation, the differential output of the two photodetectors is used in a feedback loop to stabilise the wavelength of the laser source to a desired target wavelength. Through the angular dependence of wavelength transmission of the Fabry-Perot etalon, the wavelength variation from the source is converted to a transmission loss, which is different for the two photodetectors, so that the wavelength change is detected as a differential power change. The device functions as an optical wavelength discriminator in which the detectors convert optical energy to current for a feedback loop for controlling the light source. A lens may be used to control the divergence of the light incident on the filter element to optimise power transfer. Optionally, wavelength tunability is provided by changing the angle of inclination of the Fabry-Perot etalon relative to the laser source.

In the arrangement of U.S. Pat. No. 6,094,146 the light emitted by a laser diode is propagated towards an interference optical filter. Light passing through the filter and the light reflected therefrom are caused to impinge onto two photodiodes to generate respective output signals. The ratio of those signals is calculated in an arrangement including an adder, a subtractor and a divider. The arrangement further includes an error detector adapted to detect the difference between the output ratio and a reference value. The emission wavelength of the laser diode is controlled in such a way that the error signal may be equal to zero.

In the arrangement of U.S. Pat. No. 6,377,592 B1 the light emitted by a laser diode is propagated towards wavelength-neutral power dividers implemented in the form of two semitransparent mirrors as surfaces of the same body of transparent material such as glass.

Somewhat similar arrangements are also known from U.S. Pat. No. 5,781,572, U.S. Pat. No. 6,384 947, EP-A-1 218 983 and JP07095159.

A number of factors must be taken into account in applying such arrangements in order to produce compact stabilised optical sources.

Generating optical signals proportional to the optical power and wavelength of a laser source almost invariably requires the radiation from the laser source to be split over distinct propagation paths. This may turn out to be a fairly critical solution, especially when the laser beam emitted from the back facet of the laser is exploited for stabilisation purposes as an alternative to splitting a fraction of the main beam generated from the front facet of the laser.

In order to collect sufficient power, the light signal must be collimated into a low-divergence beam by using a lens. This arrangement necessitates a critical active alignment step, as recognised e.g. in K. Anderson, IEEE Electronic Component and Technology Conference, 1999, pp. 197–200.

Additionally, the wavelength selective components must be temperature controlled in order to avoid drifts in the wavelength locking point generated by temperature changes.

Also, the stabilization system must be compact and adapted to be included in the same package of the laser source thus tackling the related problems in terms of optical coupling, space requirements (small "footprint") and power dissipation.

SUMMARY OF THE INVENTION

The object of the present invention is thus to provide an improved arrangement overcoming the drawbacks of the solution of the prior art considered in the foregoing.

According to the present invention, that object is achieved by means of arrangement having the features set forth in the claims that follow.

Essentially, the invention consists of a wavelength control system based on marginal splitting of the actual optical output beam which, detected through the wavelength selective filter, and normalized to a reference signal indicative of the output power from the optical source forms an error signal adapted for use in the feedback control via the temperature.

A preferred embodiment of the invention consists of a particular configuration including a shaped metal (invar or kovar) frame adapted to carry properly oriented at pre-set angles the basic elements of the control system, namely the optical filter (typically an interference or etalon filter), the two splitter plates, and two back entry photodetectors. A slight tilt applied while the filter is mounted on the frame and/or the frame mounted on the substrate permits fine wavelength tuning at the operating temperature.

A preferred embodiment allows the smallest possible footprint in the transmitter optical sub-assemblies (TOSA) with respect to previous solutions. This, along with an improved space occupancy allowed by using the minimum amounts of components assembled together without additional submounts, leads to very small and narrow TOSA structures fully compliant with reduced pitch duplex optical connectors solutions (for instance LC type), as adopted in compact DWDM transceiver formats.

A two cube-like beam-splitters or a simple double-splitter consisting of a single glass plate polished as a 45° rhombic-prism, with an all-glass components assembly can be used in the place of a metal frame, which may represent a particularly cheap and simple solution.

All the optical components and the temperature sensor are mounted on a small optical bench substrate of good thermal and mechanical performance.

BRIEF DESCRIPTION OF THE DRAWINGS

The arrangement of the invention will now be described, by way of example only, with reference to the annexed figures of drawing, wherein:

FIG. 1 is a schematic representation of an optical wavelength control system,

FIG. 2 shows in detail the structure of an embodiment of the invention, and

DETAILED DESCRIPTION OF THE PREFERRED EMBODIMENT(S)

Figure 3:
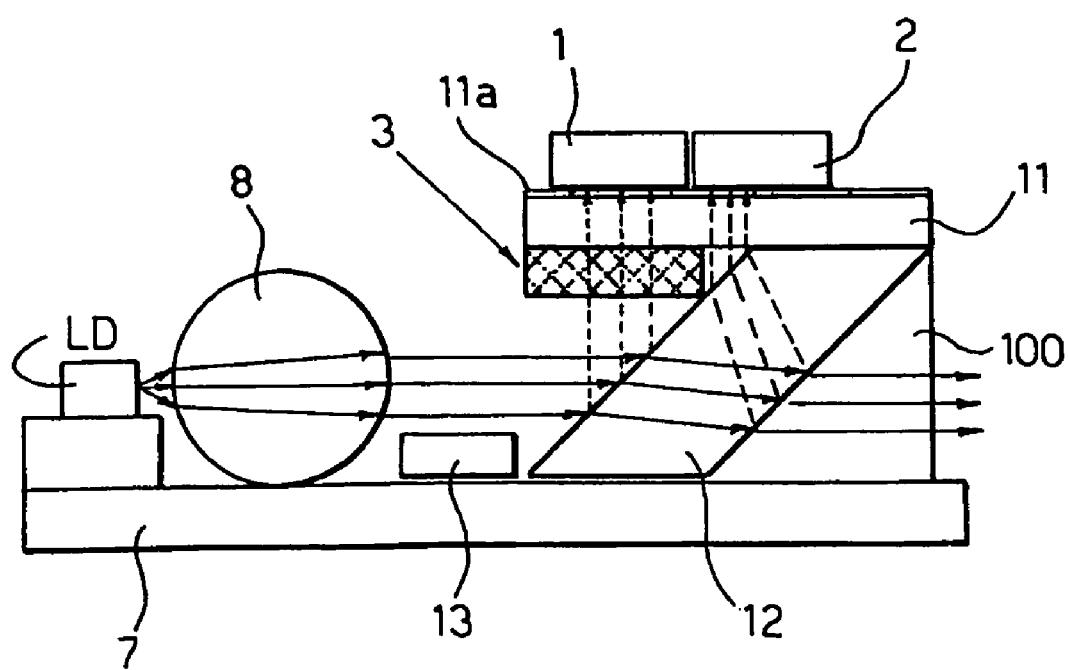
FIG. 3 shows a possible alternative embodiment of the invention.

In the block diagram of FIG. 1 a laser source such as a laser diode is designated LD. Optical radiation from the source LD is propagated over two paths leading to two photodetectors typically comprised of photodiodes 1 and 2. Interposed in the propagation path from the source LD to the photodetector 1 is a frequency (i.e. wavelength) selective optical filter 3.

The photodiode 2, used as a reference, samples an unfiltered portion of the radiation i.e. the laser beam. The response (i.e. the photocurrent) from the photodiode 2 is thus indicative of the power emitted by the optical source.

The portion of the laser beam passed through the optical filter 3 and caused to impinge onto the photodiode 1 causes the response of the photodiode 1 to be a function of the possible displacement of the actual wavelength of the beam generated by the laser source LD with respect to the wavelength of the filter 3.

The photocurrents from photodiodes 1 and 2 can thus be fed to a processing unit 4 and a loop filter/Peltier driver to drive a Peltier element 6 associated to the laser source LD and thus adapted to control the source temperature to achieve wavelength stabilization.

The arrangement shown in FIG. 1 can thus be essentially regarded as comprising an optical wavelength control system for an optical source such as a laser diode LD.

The system shown includes:

a beamsplitter arrangement for propagating radiation from the source over two paths, a first photodetector 1 and a second photodetector 2 each arranged in a respective one of said two propagation paths, a wavelength selective optical filter 3 interposed in the propagation path from the source LD to the first photodetector 1, whereby the first photodetector 1 and the second photodetector 2 are adapted to generate photocurrents indicative of the possible displacement of the actual wavelength of the radiation from the source LD with respect to a reference wavelength (as represented by the center wavelength of the filter 3) and of the power emitted by the optical source LD, respectively.

The "wavelength locker" arrangement shown in FIG. 1 is thoroughly conventional in the art, thus making it unnecessary to provide a more detailed description herein.

In the embodiment shown in FIG. 2, the transmitter includes a laser diode LD mounted on an optical bench (OB) 7 together with a lens 8 such as a spherical lens 8 for collimating the optical beam generated by the laser diode LD.

Similarly mounted on the optical bench 7 are two partial (a few percent reflectance) beamsplitters 9 and 10 arranged in a cascaded fashion to be traversed by the radiation beam produced by the laser source LD.

The beamsplitters 9 and 10 split from the main emission (laser beam) from the source LD two perpendicular beams, directed towards two photodetectors.

These two photodetectors (designated 1 and 2 for direct reference to the general arrangement shown in FIG. 1) are usually comprised of photodiodes sensitive to the emission wavelength from the source LD.

A wavelength selective optical filter/etalon 3, having a spectral characteristic transmittance continuously changing as a function of the wavelength, is interposed in the optical path from the beamsplitter 9 to the photodiode 1, while the radiation from the beamspitter 10 impinges unfiltered onto the photodiode 2 to be detected thereby.

As previously explained, the (photo)current from the photodetector 1 will represent a wavelength-correlated signal.

This can be normalized with respect to the optical power signal represented by the (photo)current from the photodetector 2 and compared with a reference to produce an error signal. Such an error signal is adapted to be fed e.g. to a loop filter and Peltier driver block 5 as shown in FIG. 1 to effect electronic control of the emission wavelength of the laser diode LD; this is achieved by the fine regulation of the laser diode temperature through the Peltier element 6.

The optical power correlated signal from the photodetector 2 can also be exploited for automatic power control of the laser radiation by regulating (by known means) the bias current of the laser diode LD.

A notable feature of the arrangement shown herein is the wavelength control system based on a marginal splitting of the actual optical output beam from the laser source LD.

The wavelength selective optical filter 3 is typically comprised of a glass plate (typically an interference or etalon filter) mounted over the top of the cube comprising the first beamsplitter 9.

A periodic filter (e.g. etalon) may be used as the filter 3, which allows the stabilization of the source over any of several equally spaced wavelengths (comb arrangement) to fit with multi-wavelength DWDM tunable laser diode sources.

In the embodiment shown in FIG. 2 a L-shaped glass substrate 11 is provided straddling the two beamsplitters 9 and 10, the recessed portion of the L shape being adapted to receive the optical filter 3, while the upper surface of the substrate 11 carries a metal pattern 11a for mounting the two photodetectors 1 and 2.

As an alternative to the two cube-like members shown in FIG. 2, the beamsplitters 9 and 10 can be simply comprised of two partial beamsplitter plates.

As a further alternative shown in FIG. 3, a simple double splitter 12, consisting of a single glass plate polished as a 45° rhombic-prism, can be used as a cheaper solution in the place of the cube-like beam-splitters 9 and 10 shown in FIG. 2.

As shown in FIG. 3, if the double splitter 12 is used, the substrate 11 may merely consist of a flat glass plate of uniform thickness carrying the etalon/filter 3 in a position facing the splitter 12.

The arrangement shown achieves a very small "footprint" for particularly compact solutions. It will in fact be appreciated that the two beamsplitters 9 and 10 with the associated glass substrate 11, the optical filter 3 and the photodiodes 1 and 2 comprise a sort of a stack extending "upwardly" from the optical bench 7 i.e. in a direction generally transverse the propagation direction of the laser beam from the source LD and perpendicular to the plane of the optical bench 7.

The optical beams (as output from the laser and as subsequently split out) similarly propagate in a plane that is perpendicular to the plane of the optical bench 7.

This configuration allows a substantial reduction in size of the prior art configuration where the optical beams lie in a plane parallel to the optical bench plane. Size reduction is a key factor for the exploitation of a lambda locker in small footprint transceiver (e.g. transceivers with duplex small pitch optical connectors, for instance of the LC type).

Preferably, a frame 100 (shown only in FIG. 3), such as a shaped metal (invar or kovar) frame, may be provided adapted to carry properly oriented at pre-set angles the basic elements of the control system, namely the optical filter 3, the beamsplitter arrangement 9, 10 and at least one of the two back entry photodetectors 1 and 2.

A slight tilt applied while the filter is mounted on the frame or the frame mounted on the substrate (optical bench 7) permits fine wavelength tuning at the operating temperature. Specifically, these structures can be pre-assembled and mounted on the optical bench 7 with a tilt in order to fine-tune the desired stabilized wavelength.

Mounting all the optical components described (and a temperature sensor 13 preferably associated therewith) on a small silicon optical bench (SiOB) as shown at 7 leads to all the elements of the arrangement shown being carried by a substrate of good thermal and mechanical performance.

The SiOB platform is generally more convenient for modern mass production processes. Additionally, such a platform allows an efficient temperature control of the optical filter and renders mounting of the optical elements simpler. Specifically, passive alignment processes of the optical mounts can be resorted to, which results in lower costs.

Naturally, the principles of the invention remaining the same, the details of construction and the embodiments may widely vary with respect to what has been described and illustrated purely by way of example, without departing from the scope of the present invention as defined by the annexed claims. For instance, those of skill in the art will promptly appreciate that, at least in the embodiment shown in FIG. 2, the roles of the beamsplitters 9 and 10 and the arrangement of the filter 3 may in fact be reversed with respect to the embodiment shown. Finally, it will be appreciated that terms such as "optical", "light", "photosensitive", and the like are used herein with the meaning currently allotted to those terms in fiber and integrated optics, being thus intended to apply to radiation including, in addition to visible light, e.g. also infrared and ultraviolet radiation.

What is claimed is:

1. An optical wavelength control system for an optical source, the system including:
   a beamsplitter arrangement for propagating radiation from said source over two paths;
   first and second photodetectors each arranged in a respective one of said two propagation paths;
   a wavelength selective optical filter interposed in the propagation path from said source to said first photodetector, whereby said first and second photodetector are adapted to generate photocurrents indicative of the possible displacement of the actual wavelength of the radiation from said source with respect to a reference wavelength and the power emitted by the optical source, respectively; and
   a support bench extending in a given plane,
   wherein said beamsplitter arrangement is arranged to split said radiation from said source towards said first and second photodetectors in a direction substantially perpendicular said given plane of said bench, and wherein said beamsplitter arrangement, said optical filter and said photodiodes comprise an assembly having an associated a frame carrying said beamsplitter arrangement, said optical filter and at least one of said photodiodes oriented at pre-set angles.

2. The system of claim 1, wherein said wavelength selective optical filter is mounted over said beamsplitter arrangement and said beamsplitter arrangement, said optical filter and said photodiodes comprise an assembly extending in a direction substantially perpendicular said given plane of said bench.

3. The system of claim 1, wherein said filter is adapted to be mounted on said frame with a selectively determined tilt.

4. The system of claim 1, wherein said frame is adapted to be mounted on said bench with a selectively determined tilt.

5. The system of claim 1, wherein said beamsplitter arrangement includes an associated substrate for mounting said optical filter.

6. The system of claim 5, wherein said associated substrate includes a recessed portion adapted to receive said optical filter.

7. The system of claim 5, wherein said associated substrate is L-shaped.

8. The system of claim 5, wherein said associated substrate carries a metal pattern for mounting at least one of said first and second photodetectors.

9. The system of claim 1, wherein said beamsplitter arrangement includes two partial beamsplitters arranged in a cascaded fashion to be traversed by the radiation from said source.

10. The system of claim 9, wherein said beamsplitter arrangement includes an associated substrate for mounting said optical filter and said associated substrate is arranged straddling said two beamsplitters.

11. The system of claim 1, wherein said beamsplitter arrangement includes a double splitter.

12. The system of claim 11, wherein said double splitter includes a single plate polished as a 45° rhombic-prism.

13. The system of claim 11, wherein said beamsplitter arrangement includes an associated substrate for mounting said optical filter, and said associated substrate includes a flat plate carrying said filter in a position facing said double splitter.

14. The system of claim 1, wherein said optical source comprises a laser source.

15. The system of claim 1, further comprising a lens for collimating the radiation from said optical source.

16. The system of claim 1, wherein said support bench comprises a silicon optical bench.

17. The system of claim 1, wherein said filter comprises a periodic filter.

18. The system of claim 17, wherein said periodic filter comprises an etalon filter.

* * * * *